United States Patent [19]

Kosugi

[11] Patent Number: 5,386,269
[45] Date of Patent: Jan. 31, 1995

[54] ALIGNMENT AND EXPOSURE APPARATUS

[75] Inventor: Masao Kosugi, Yokohama, Japan

[73] Assignee: Canon Kabushiki Kaisha, Tokyo, Japan

[21] Appl. No.: 215,979

[22] Filed: Mar. 21, 1994

Related U.S. Application Data

[63] Continuation of Ser. No. 962,052, Oct. 16, 1992, abandoned, which is a continuation of Ser. No. 795,259, Nov. 19, 1991, abandoned, which is a continuation of Ser. No. 700,932, May 13, 1991, abandoned, which is a continuation of Ser. No. 598,820, Oct. 17, 1990, abandoned, which is a continuation of Ser. No. 349,222, May 9, 1989, abandoned.

[30] Foreign Application Priority Data

May 12, 1988 [JP] Japan .................. 63-115534

[51] Int. Cl.⁶ .............................. G03B 27/52
[52] U.S. Cl. ............................ 355/43; 355/53
[58] Field of Search ............ 355/43, 45, 53, 77; 356/400, 399

[56] References Cited

U.S. PATENT DOCUMENTS

| | | | |
|---|---|---|---|
| 4,640,619 | 2/1987 | Edmark, III | 356/372 |
| 4,741,622 | 5/1988 | Sawa et al. | 356/401 |
| 4,861,162 | 8/1989 | Ina | 355/53 X |
| 4,875,076 | 10/1989 | Torigoe et al. | 355/53 |
| 5,140,366 | 8/1992 | Shiozawa et al. | 355/53 |

FOREIGN PATENT DOCUMENTS

| | | |
|---|---|---|
| 0035113 | 9/1981 | European Pat. Off. |
| 0295860 | 12/1988 | European Pat. Off. |
| 61-263123 | 11/1986 | Japan |
| 62-94932 | 10/1987 | Japan |

Primary Examiner—D. Rutledge
Attorney, Agent, or Firm—Fitzpatrick, Cella, Harper & Scinto

[57] ABSTRACT

An exposure apparatus including a wafer holder for holding a wafer, a movable wafer stage for carrying thereon the wafer holder, a recording layer provided on the wafer holder, and a detector for detecting a predetermined pattern recorded in a portion of the recording layer.

14 Claims, 7 Drawing Sheets

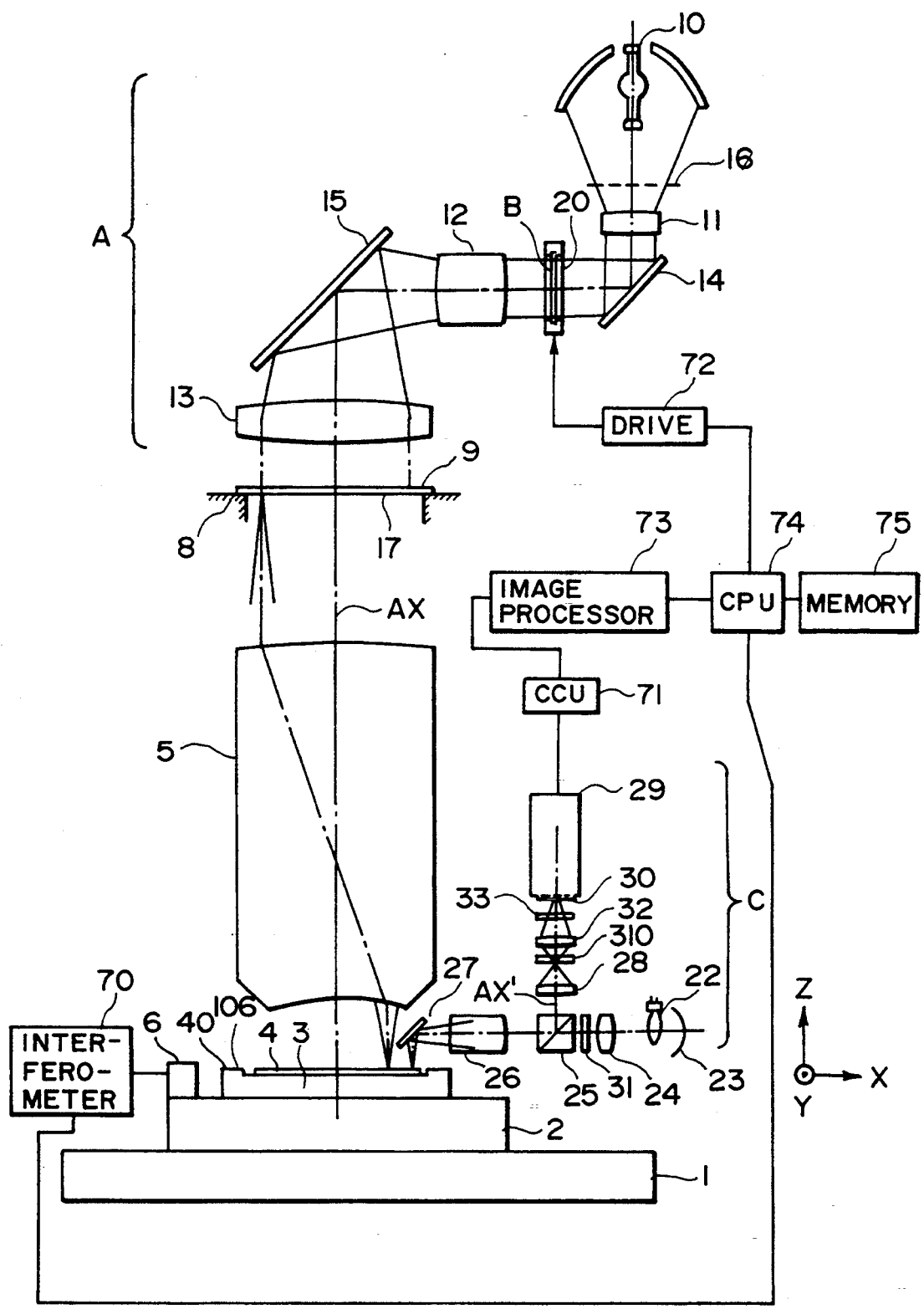
F I G. 1

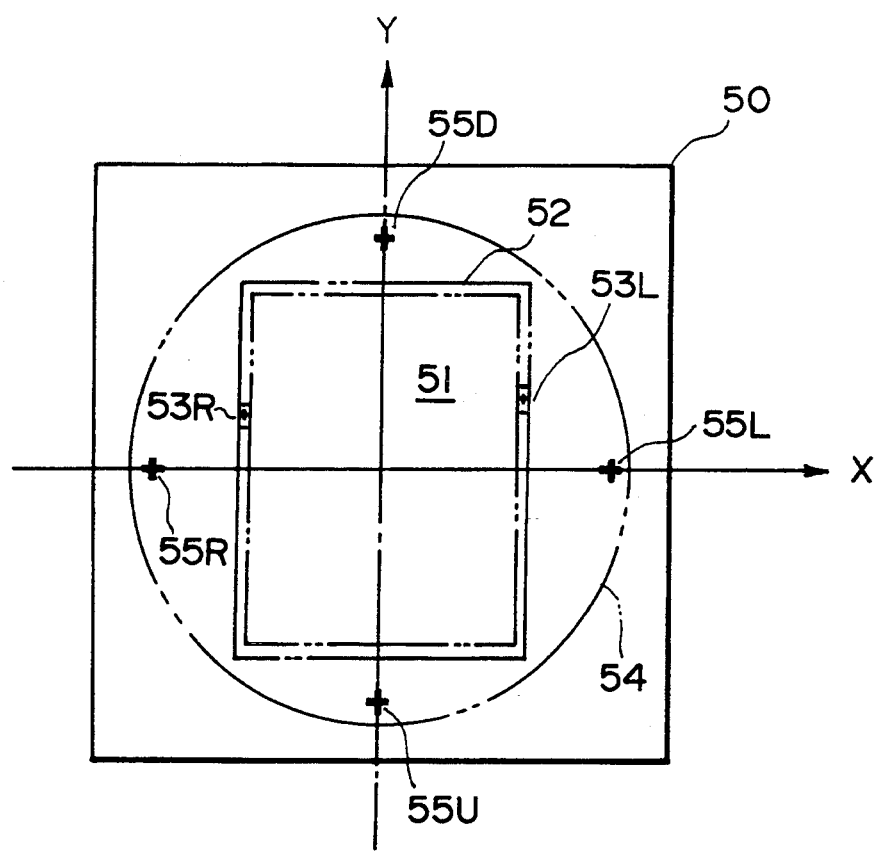
F I G. 3

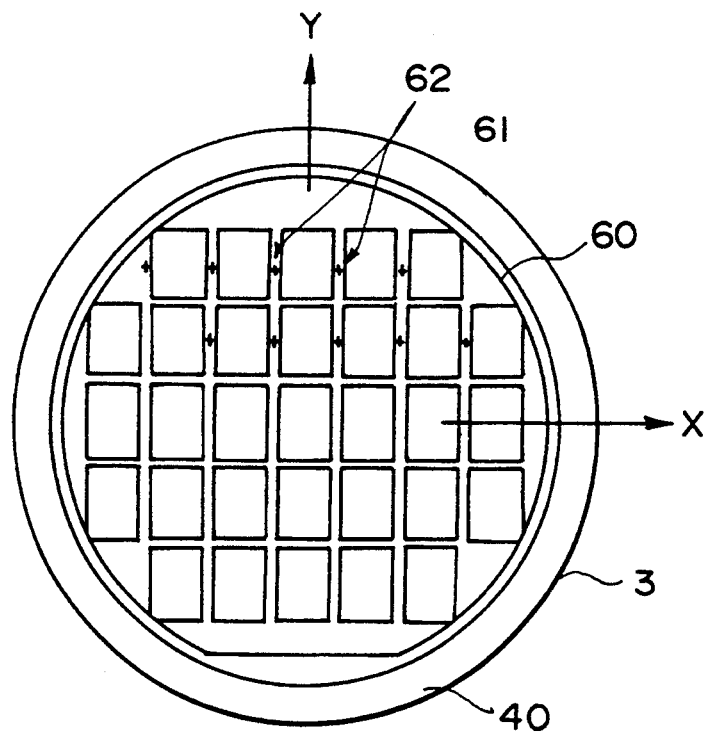
F I G. 4A
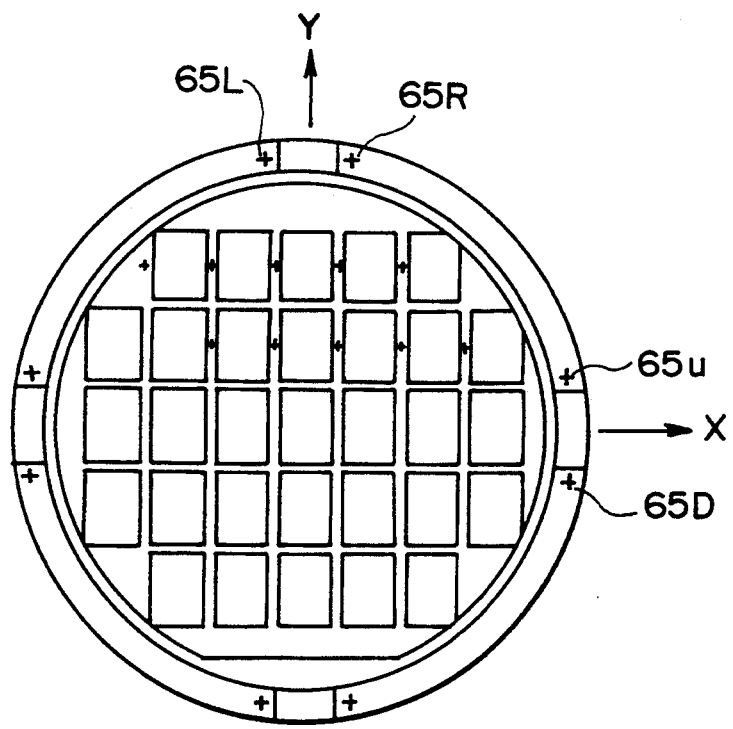
F I G. 4B

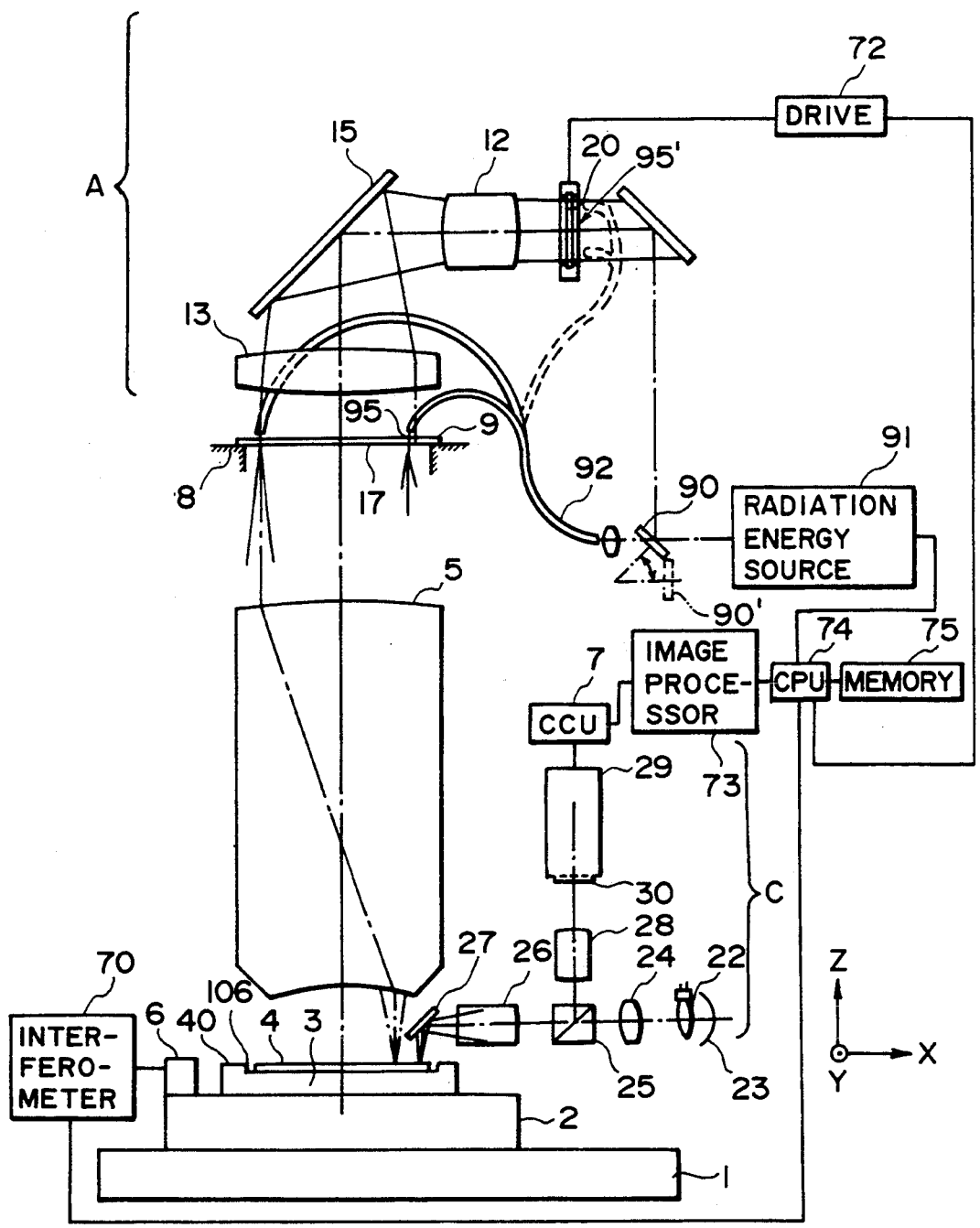
F I G. 5

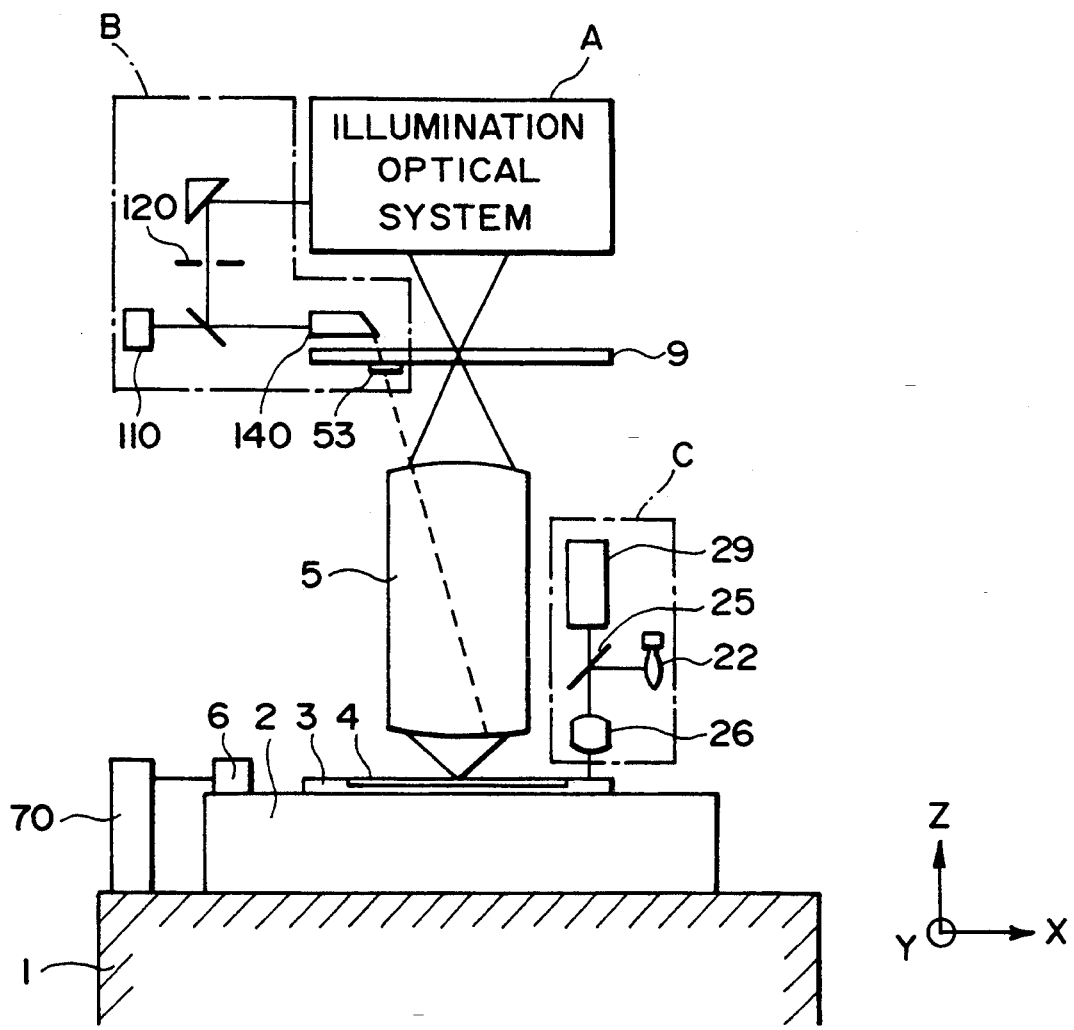
F I G. 9

ALIGNMENT AND EXPOSURE APPARATUS

This application is a continuation of application Ser. No. 07/962,052 filed Oct. 16, 1992, now abandoned, which is a continuation of application Ser. No. 07/795,259 filed Nov. 19, 1991, now abandoned, which is a continuation of application Ser. No. 07/700,932 filed May 13, 1991, now abandoned, which is a continuation of application Ser. No. 07/598,820 filed Oct. 17, 1990, now abandoned, which is a continuation of application Ser. No. 07/349,222 filed May 9, 1989, now abandoned.

FIELD OF THE INVENTION AND RELATED ARTS

This invention relates to an exposure apparatus for use in the manufacture of semiconductor microcircuit devices such as integrated circuits (ICs), large scaled integrated circuits (LSIs) and the like. More particularly, the invention is concerned with a unique process and system in relation to alignment and exposure in an alignment and exposure apparatus called a "mask aligner".

Resolution and alignment accuracy are basic characteristics required in a mask aligner. Also, the (throughput) must be higher for the mask aligner to be a productive machine. The development of semiconductor devices with improved miniaturization and higher capacity has forced further improvements in the resolution and alignment accuracy.

With the miniaturization of devices, there has occurred a transition in exposure processes adopted in mask aligners: that is, there have been developed contact/proximity type apparatus, 1:1 mirror projection type apparatus and lens projection type apparatus in this order. At present, a step-and-repeat type projection exposure apparatus (called a "stepper") using exposure light energy of a wavelength 350–450 nm, is the prevailing type of apparatus used.

Further, as an aligner for the manufacture of the next generation devices, such a stepper which uses a light source that can supply light of a shorter wavelength (for example, a stepper using as an exposure beam a light having a relatively high intensity and a short wavelength of the order of 250 nm, such as a laser beam from a KrF excimer laser, for example), is considered as being effective. In this type of mask aligners, higher precision is required, along with improvements in the resolution, in regard to the pattern overlay or superposition accuracy related to overlaying a circuit pattern of a mask or reticle upon a pattern already formed on a wafer. In a case of 16 mega-DRAM, for example, for a resolution of 0.5 micron, a pattern overlay accuracy of about 0.15 micron and an alignment accuracy of about 0.1 micron are required.

Thus, development of a unique alignment system that ensures a high-precision pattern overlay has been desired. In an attempt to meet this demand, improved alignment systems have been proposed in Japanese Laid-Open Patent Applications, Laid-Open Nos. Sho 61-263123 and Sho 62-94932.

The alignment systems disclosed in these publications utilize, for the purpose of alignment, a wafer chuck adapted to hold thereon a wafer by attraction. An alignment mark is provided on the wafer chuck, and by using an off-axis microscope and an X—Y stage the relative position of an alignment mark formed on the wafer and the alignment mark of the wafer chuck is detected and stored in a memory. After this, the relative position of the alignment mark of the wafer chuck and an alignment mark provided on a reticle is detected by using a projection lens system (provided for the projection exposure) and an X—Y stage. By this means, the positional relationship between the reticle and the wafer can be detected.

SUMMARY OF THE INVENTION

Generally, the present invention concerns an improvement in an alignment system of the type that uses a wafer chuck as described and, more particularly, the invention in one aspect aims at providing a unique alignment and exposure system that assures high-precision alignment and exposure.

Briefly, in accordance with an aspect of the present invention, to achieve the above object, there is provided an alignment and exposure apparatus that includes a reticle stage for holding a reticle, a holding means for holding a wafer, a movable wafer stage for carrying thereon the holding means, an illumination means for illuminating the reticle, a projection system for projecting a circuit pattern of the reticle on the wafer, a measuring means for measuring the amount of movement of the wafer stage and an observation system disposed adjacent to the projection system for observation of an alignment mark provided on the wafer, wherein the wafer holding means is provided with a recording layer.

One preferred form of alignment and exposure apparatus of the present invention uses, for the recording layer, a writable and erasable recording material such as, for example, a magneto-optic recording material or a photochromic material having radiation-sensitivity, and thus the recording layer can be used repeatedly.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of an alignment and exposure apparatus according to an embodiment of the present invention.

FIG. 3 is a schematic top plan view of a reticle prepared for an N-th process.

FIGS. 4A and 4B are top plan views, respectively, showing a wafer and a wafer chuck for the N-th process.

FIG. 5 is a schematic and diagrammatic view of an alignment and exposure apparatus according to another embodiment of the present invention.

FIG. 9 is a schematic and diagrammatic view of an alignment and exposure apparatus according to a further embodiment of the present invention.

DESCRIPTION OF THE PREFERRED EMBODIMENTS

Figure 2:
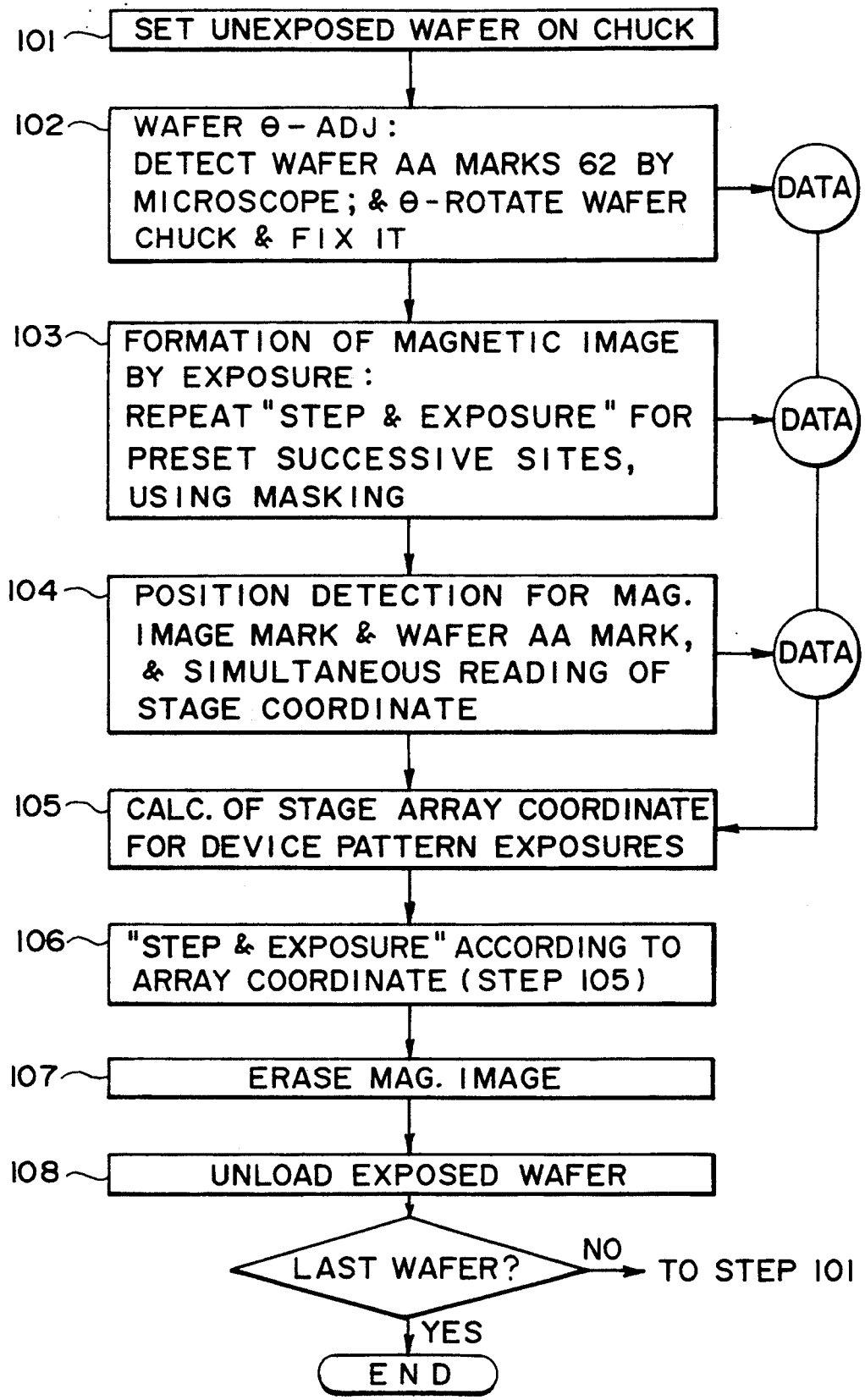
FIG. 2 is a flow chart showing the sequence of alignment and exposure adopted in the alignment and exposure apparatus of the FIG. 1 embodiment.

FIG. 1 shows an alignment and exposure apparatus according to a first embodiment of the present invention.

The main assembly of the exposure system is carried by a surface plate 1. Disposed on the surface plate 1 is a wafer stage 2 which is adapted to support a wafer chuck 3 and a wafer 4, held on the chuck 3 by attraction, for movement in a plane (X—Y plane) perpendicular to an optical axis AX of a projection lens system 5 and in a direction (Z-axis direction) along the optical axis AX. The wafer stage 2 has formed thereon an optical mirror 6 on which a beam 7 from a laser interferometer 70 is projected, whereby the amount of movement of the wafer stage 2 can be measured in a known manner. Also, the position coordinate of the wafer stage 2 in the X—Y plane can be detected accurately. In response to a signal as produced by the interferometer 70, the movement of the wafer stage 2 through a specified distance can be controlled in a known manner. Disposed above the projection lens system 5 is a reticle 9 which is held by a reticle holder 8. The reticle holder 8 is movable in a plane parallel to the X—Y plane. Disposed above the reticle 9 is an illumination optical system generally denoted at reference A. When light is supplied to the reticle 9 from the illumination optical system, a circuit pattern formed on the reticle 9 can be transferred by projection onto a resist or photoresist layer formed on the wafer 4, through the projection lens system 5.

The illumination optical system A comprises a light source 10 such as a super Hg lamp, first to third condenser lenses 11-13 provided to uniformly illuminate the surface of the reticle 9 with light supplied by the light source 10, and first and second mirrors 14 and 15 provided to bend or deflect the light. Shutter 16 is provided to control the exposure.

The second and third condenser lenses 12 and 13 and the second mirror 15 are arranged to cooperate with each other to define, at a position denoted at B in FIG. 1, a plane which is optically conjugate with a pattern bearing surface 17 of the reticle 9 (a surface facing the projection lens system 5). By disposing an appropriate masking member such as at 20 on the plane B, only a desired portion of the reticle 9 can be illuminated. The selective illumination using such a masking blade means 20 is known in the art, as disclosed in U.S. Pat. No. 4,474,463, for example. In this embodiment, four independently movable blades are used as the blade means 20, the blades being adapted to be actuated by a driving circuit 72 to variably define a desired aperture of rectangular shape.

Disposed close to the projection lens system 5 is an off-axis alignment optical system C having an optical axis AX' which is parallel to the optical axis of the projection lens system 5. The alignment optical system C is arranged such that light emanating from a halogen lamp 22 is concentrated by a condensing mirror 23 and a condensing lens 24 and, after being directed by way of a first polarization plate 31, a half mirror 25, an objective lens 26 and a swingable mirror 27, it impinges on the wafer 4 surface or a portion of the wafer chuck 3 surface, denoted at 40 in FIG. 1. The light reflected from the surface goes along its oncoming path and, after being reflected or transmitted by the swingable mirror 27 and the objective lens 26, it is deflected upwardly, at a right angle, by the half mirror 25. Thus, through a relay lens 28, the light illuminates a reference mark plate 310, whereby a pattern provided on the wafer 4 surface or the chuck 3 surface is once imaged on the reference mark plate 310.

Erector 32 is adapted to image, on the surface 30 of an image pickup tube 29, a reference mark formed on the reference mark plate 310 and the image of the pattern of the wafer 4, for example. Second polarization plate 33 is disposed between the erector 32 and the image pickup tube 29. Thus, only the light having been polarized in a predetermined direction can be received by the image pickup tube 29. Namely, the alignment optical system C provides a polarization microscope.

Signals from the image pickup tube 29 are transmitted through a CCU 71 to an image processing circuit 73, in which the image of the reference mark of the reference mark plate 31, an image of an alignment mark pattern of the wafer 4 and an image of a magnetic pattern formed on the chuck 3 (which will be described later) can be processed. For example, the image processing circuit 73 is operable to detect the positional relationship of the wafer alignment mark or the magnetic pattern with the reference mark of the reference mark plate 31.

At a portion of the wafer chuck 3 surface, which is outside a wafer 4 as it is attracted to the chuck 3 (namely, the portion of the wafer chuck 3 that does not contact the wafer 4), there is provided a protrusion 40 whose surface has a height, with respect to the direction of the optical axis AX, which is substantially equal to the height of the wafer 4 surface. The surface of the protrusion 40 is covered with a magneto-optic recording material 106. As an example, the magneto-optic recording material may be made of a well-known rare earth transition metal alloy.

In a magneto-optic recording material, normally the direction of magnetization is uniformly aligned (e.g. upwardly). If, however, an inverse magnetic field (e.g. downward magnetic field) is applied to the magneto-optic recording material and if light energy is supplied thereto, there occurs inversion of the direction of magnetization only in such portion that has been exposed to the light. Thus, there appears a magnetic pattern (a pattern defined by a change in a magnetic domain) that is provided by a portion in which the magnetization is normal and a portion in which the magnetization is reversed; the thus formed pattern can be observed through the alignment optical system C which constitutes a polarization microscope.

Further, when an intense magnetic field inverse to that applied during the recording (e.g. an upward magnetic field) is applied to the magneto-optic recording material, the magnetization returns to its initial normal state. Thus, with this type of recording material, both the writing of a pattern and the erasing of the recorded pattern are possible.

Figure 6:
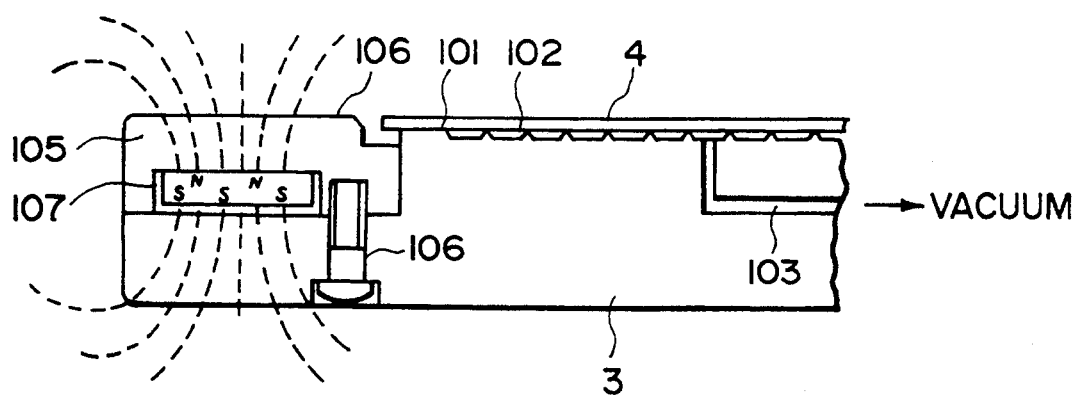
FIG. 6 is a fragmentary section of a wafer chuck.

FIG. 6 is a fragmentary section of a wafer chuck 3 usable in this embodiment. Although many varieties of arrangements are usable as the means for producing weak magnetic lines of force (magnetic field) for formation of such a magnetic image, in this embodiment use is made of a permanent magnet means which is embedded in the wafer chuck 3. This permits the system to be kept continuously ready for formation of a magnetic image. As contrasted thereto, use of a coil or otherwise causes a possibility of generation of heat due to an electric current supplied to the coil and the resistance thereof. Use of a permanent magnet means is inexpensive and sure.

The wafer chuck 3 is provided at its wafer holding surface with a seal surface 101 of ring-like shape, formed at peripheral portion of the chuck, and an inside pin-chuck means having a number of pins 102. The pin-chuck means is evacuated to vacuum through a passageway 103 formed in the chuck, whereby a wafer 4 can be attracted to the chuck and the flatness of the wafer can be corrected.

Disposed around the wafer chuck 3 is a ring 105 which is coupled to the chuck 3 by a magnetic-optic recording material 106. On the surface of the ring 105 the magneto-optic recording material 106 is formed in a layer structure by an evaporation or sputtering process. As described hereinbefore, the position of the surface of the recording material with respect to the direction of the optical axis AX of the projection lens 5 is substantially the same as the surface position of the wafer 4.

The ring 105 is formed with a groove to which a permanent magnet 107 is bonded. The permanent magnet 107 has N-poles at its upper part and S-poles at its lower part, as illustrated, so that the permanent magnet produces magnetic lines of force (109) as depicted by broken lines. The permanent magnet 107 is so disposed that its magnetic lines of force denoted at 109 intersect the recording surface of the magneto-optic recording material layer 106 approximately perpendicularly.

Figure 7:
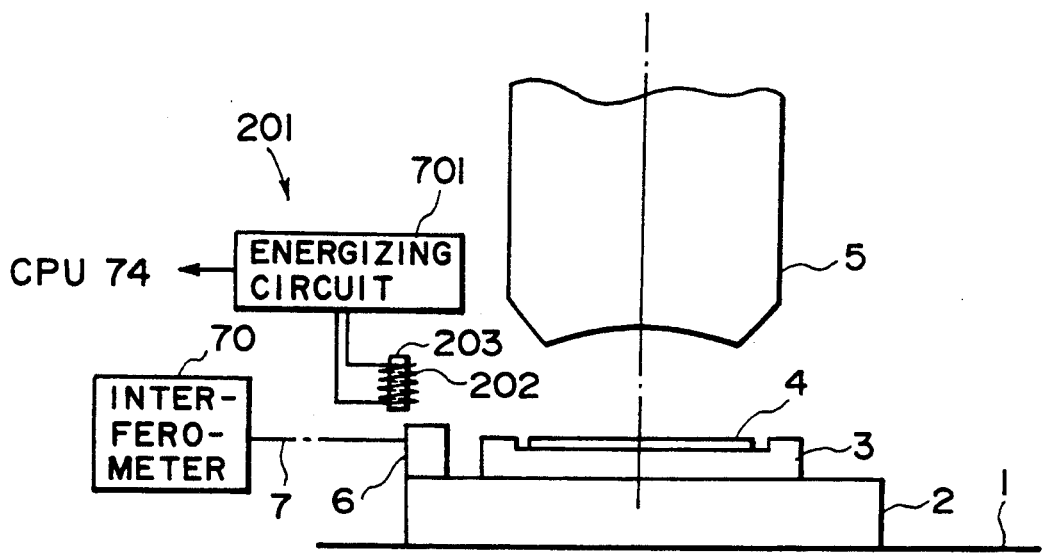
FIG. 7 is a fragmentary view showing a magnetic field producing means.

FIG. 7 shows a magnetic field producing means which is provided about the projection lens system 5.

In FIG. 7, denoted at 201 is a magnetic field producing means which comprises a magnetic head. The magnetic head 201 is used to erase a magnetic image recorded on the magneto-optic recording material 106.

Figure 8:
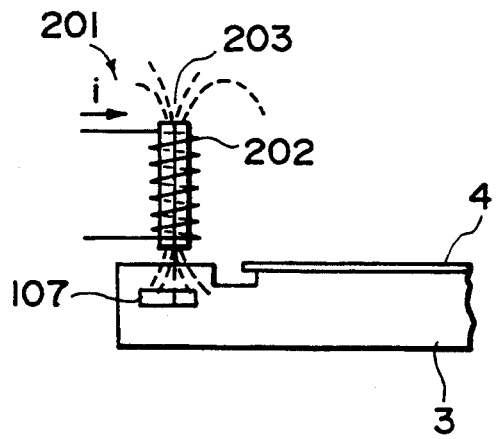
FIG. 8 is a representation showing the manner of erasing a magnetic image by the magnetic field producing means.

The sequence of erasing a magnetic image is such that: first, the wafer stage 2 is displaced so as to bring such portion of the magneto-optic recording material 106, in which a magnetic image is formed, to a site below the erasing magnetic head 201. As shown in FIG. 8, electric current is then supplied by a driving circuit 701 to a coil 202 of the magnetic head 201, whereby magnetic lines of force are produced at an iron core 203 which is provided inside the coil 202.

More specifically, in FIG. 6, electric current flows through the coil 202 so that an N-pole is defined at the magnetic head 201 side. Namely, the coil 202 is energized to assure that an N-pole is defined at the chuck 3 side of the core 203 while an S-pole is defined at an end portion of the core 203 remote from the chuck 3. If the magnetic lines of force are sufficiently intense as compared with the magnetic lines of force of the permanent magnet 107, it overcomes the magnetic lines of force of the permanent magnet 107 being embedded within the chuck 3, such that magnetic lines of force inverse to those by the permanent magnet 107 are formed substantially perpendicularly to the magneto-optic recording material layer 106. As a result, the magnetic image can be erased.

In FIG. 6, only one magnetic field (magnetic lines of force) producing means 201 is illustrated. Actually, however, a plurality of such producing means may preferably be provided around the projection lens system 5. In that case, only a slight movement of the stage is sufficient to quickly erase a magnetic image formed at any site on the wafer chuck 3.

Referring now to the flow chart of FIG. 2 and the top plan view of a reticle of FIG. 3 as well as top plan views of a wafer and a wafer chuck of FIGS. 4A and 4B, an example of the sequence of alignment and exposure that can be adopted in the exposure apparatus of the present invention will be explained.

Assume now that the alignment and exposure procedure pertains to an N-th process for executing the patterning of an N-th layer of each semiconductor device; FIG. 3 just shows a reticle 50 for the N-th process. In FIG. 3, in a portion 52 which corresponds to a scribe line surrounding an actual device pattern region 51, there are provided wafer automatic alignment marks (called "AA marks") 53L and 53R which are to be used in a process or processes following the N-th process. Although these marks 53L and 53R can be used each as a mark to be projected upon a magneto-optic recording material layer provided at a peripheral portion of a wafer chuck, in this embodiment those marks 55D, 55U, 55L and 55R, which are formed in such region that corresponds to a range outside the actual device pattern region 51 (52) and inside the effective exposure region 54 (effective view field of the projection lens system 5), are used for the pattern recording to be made on the magneto-optic recording material layer 106 provided on the chuck 3.

In the flow chart of FIG. 2, first a wafer 60 having been subjected to an (N−1)-th process is placed on and held by the wafer chuck 3 by attraction (Step 101). FIG. 4A shows this state. In FIG. 4A, rectangular patterns 61 arrayed on the wafer 60 are those actual device areas (shot areas) having been formed up to the (N−1)-th process. In the scribe lines between those actual device areas, there are wafer AA marks 62 for the N-th process, having been prepared during the preceding process. At this time, no pattern is formed on the magneto-optic recording material layer 40 at the peripheral portion of the wafer chuck 3.

At Step 102 in the flow chart, wafer AA marks 62 provided at least at two spaced sites are detected through the alignment optical system C, and the wafer chuck 3 is rotationally adjusted in a $\theta$ direction so that the direction of array of the shot areas on the wafer 60 is aligned with a predetermined reference direction of the apparatus (for example, an X-axis direction). As the wafer array direction is aligned with the reference direction, the $\theta$ position of the wafer 4 is fixed. Since the operation necessary for this is substantially the same as that of prealignment made in a conventional stepper by using an off-axis microscope, a description of the details of which will be omitted here. Of course, the detected values ($\Delta ui$, $\Delta vi$) related to each wafer AA mark position as the wafer $\theta$ position is fixed, as well as the coordinate position (xi, yi) of the stage 2 at each corresponding time are stored through the image processing circuit 73, the laser interferometer 70 and a CPU 74 in a memory 75.

Subsequently, at Step 103, formation of a magnetic image or images is executed. To this end, the wafer stage 2 is moved sequentially to preselected sites (on X—Y position coordinate) having been selected for formation of magnetic images, wherein at each site the shutter 16 is opened to expose alignment marks 55 of the reticle 50 to light, whereby through the projection lens system 5 magnetic images of the exposed alignment marks 55 are formed in a preselected portion of the magneto-optic recording material layer 40 provided on the wafer chuck 3. Until exposures of a predetermined number are completed, the "step and exposure" is repeated. Of course, the coordinate position (Exj, Eyj) of the stage at each exposure is read and stored into the memory 75. The selection of the magnetic image forming alignment marks 55D, 55U, 55L and 55R of the reticle 50, for printing an image at an appropriate position on the magneto-optic recording material layer 40, is made under the influence of the masking blade means 20. Also, the masking blade means 20 is used to prevent any effective shot area on the wafer from being exposed during the exposure of the magnetic image forming marks 55D–55R. The magnetic images formed as a result of these exposures are illustrated in FIG. 4B.

In this embodiment, as shown in FIG. 4B, four exposures may be made to form eight magnetic image marks 65 at upper, lower, left and right portions of the chuck, as viewed in this Figure.

At Step 104, by using the alignment optical system C and the laser interferometer 70, the position of each magnetic image mark 65j (j=L, R, U, D ... ) as well as the position of each wafer AA mark 62i (i=1, 2, 3, ... ), namely, ($\Delta uj$, $\Delta vj$) and ($\Delta ui$, $\Delta vi$), are detected and, additionally, the coordinate position (xj, yj) (xi, yi) of the stage at each corresponding time is read. Here, the magnetic image marks and the wafer AA marks may be read in any desired order. However, it is preferable to so determine the order so as to reduce the total time to the minimum.

It is to be noted here that the number of wafer AA marks to be detected, the number of shots for printing magnetic images, the number of marks to be selected as the subject of printing, the number of magnetic images to be detected, the times of detecting operations to be made for each magnetic image and the like, during Steps 102–104, should be determined in accordance with the required overlay precision for the N-th process.

Thus, as regards the wafer AA marks at Step 104, for example, the maximum number is that of all the marks of all the shot areas. As for the minimum, on the other hand, use of the data at Step 102 may be considered in some case as being sufficient, such that the number of detections at Step 104 may be made zero.

In this embodiment, at some of the steps described hereinbefore, the projection magnification of the projection lens system 5 and any $\theta$ error of the reticle 9 can be checked. Also, in some occasion, any positional error of the wafer 4 in the direction of the optical axis can be detected by detecting contrast of the magnetic image, for example.

At Step 105, computation may be made on the basis of the data obtained at Steps 102–104, for determination of the actual array coordinate of the device patterns (shot areas) on the wafer, which coordinate is to be used in the "step-and-repeat" exposure at a later stage. While, also in this case, the coordinate can be calculated in various ways, basically, such a coordinate system that has been obtained during the formation and detection of the magnetic images may be used as a reference to correct the coordinate data of the wafer AA mark. Then, at Step 106, sequential stepwise movements of the wafer stage 2 accompanied by exposures are made in accordance with the coordinate of the device pattern array as determined at Step 105.

In this embodiment, the masking blade means 20 is used to restrict the illumination range by the illumination light, such that the illumination light can be directed to the circuit pattern surface 17a of the reticle 9 but the illumination light is prevented from being directed to the magnetic image forming alignment marks 55 of the reticle 9.

At Step 107, the magnetic images having been formed in a portion of the magneto-optic recording material 40 on the wafer chuck 3 are erased. Where the wafer chuck 3 itself is provided with a suitable erasing means, the magnetic image may be erased before Step 106 or, alternatively, it may be erased in the course of Step 105 or 106.

Where an erasing means is to be annexed to the wafer chuck 3 itself, the above-described magnetic head 201 may be embedded within the chuck. In such a structure, a magnetic image can be erased at any wafer stage position, without moving the stage 2. Further, such an embedded magnetic head may be used also for production of a magnetic field for formation of a magnetic image.

The alignment procedure is not limited to the described one. Namely, what is to be made in this embodiment, after fixation of the $\theta$ position of the wafer, is that:

(1) each of preselected alignment marks on a wafer 4 is introduced into a view field of the alignment optical system C, and a data of the detected position of the mark as well as a data of the stage position at a corresponding time are stored as information;

(2) magnetic image mark of the reticle is formed at a preset position and, simultaneously therewith, data concerning the position of the stage at that time is detected and memorized, while, on the other hand, each magnetic image mark is introduced into the view field of the alignment optical system C and data of the detected position of the image mark as well as data of the position of the stage at that time are stored as information; and (3) by using the data obtained at (1) and (2), the coordinate of the actual device pattern (shot area) array for the "step and exposure" is calculated.

The order of these processings is not important. Further, it is sufficient that a magnetic image is erased before the succeeding formation of a fresh magnetic image in the same region.

With the alignment process described above, the wafer stage 2 has to be moved frequently. If, therefore, the process is executed exactly in accordance with the sequence of the flow chart of FIG. 2, the total amount of movement of the wafer stage 2 becomes large (i.e. the time for movement becomes long), with a result of prolonged processing time per one wafer.

Actually, therefore, since the positions of wafer alignment marks to be detected and the positions of magnetic images to be formed and detected are predetermined, an appropriate sequence may preferably be determined to reduce the time for moving the stage, and this can be easily programmed by using a CPU.

In accordance with the alignment and exposure apparatus of the present embodiment, although it uses an off-axis alignment system, the inconveniences in respect to precision that has been involved conventionally can be alleviated significantly and, therefore, the precision can be improved significantly. Further, there is a specific advantage that the above-described effects can be accomplished without any weak point inherent to the system and without a particular obstruction to embodying the structure.

As contrasted to the foregoing embodiment, a magneto-optic recording material may be replaced by a photochromic material. Where a photochromic material is used, there are advantages that a particular condition of using a magnetic field for writing is not necessary and that, since the photochromic material shows an accumulation type reaction, even if the exposing energy is low, an image can surely be formed although a prolonged time is necessary. Further, as regards the erasing operation, an image can easily be erased by using heat or white light. Additionally, where a photochromic material is used, it is not necessary to provide the off-axis alignment optical system by using a polarization microscope. A traditional off-axis alignment scope or an ordinary microscope may be used.

On the other hand, the magneto-optic recording material used in the foregoing embodiment has no energy accumulation property and, when the optical energy per unit time becomes lower than a certain critical value, no magnetic image can be formed. Thus, it is necessary to set the illuminance of the irradiating light upon the image surface at a sufficient level.

In consideration of this, although the structure may become somewhat complicated, it may be preferable that, as shown in FIG. 5 which represents a second embodiment of the present invention, an optical energy which is stronger than that of the regular exposure illumination light, is concentratingly applied to the magnetic image forming mark portion. More specifically, in the example of FIG. 5, a mirror 90 which can be used, for the regular exposure, to direct the light from a light source 91 to the illumination optical system A, is made retractable, such that for formation of a magnetic image the mirror 90 is retracted to a position as depicted at reference numeral 90'. This allows the light from the light source 91 to be directly introduced to fibers 92, which are provided separately, the light emanating from the fibers being directly projected upon those portions 95 of the reticle 9 upper surface at which magnetic image forming alignment marks are provided. Alternatively, the fibers 92 may be extended close to the masking blade means 20, so that the wafer chuck 3 is indirectly irradiated and exposed to the light from the fibers 92 by way of an optical arrangement disposed downstream of the masking surface 95' with respect to the path of light. Further, in place of using the fibers 92, a separate laser light source for producing light of high intensity may be provided to allow the portions 95 of the reticle upper surface to be irradiated and exposed with the laser beam from such a laser source.

Further, as the light source 91 shown in FIG. 5, a KrF excimer laser may be used. Namely, where the invention is to be embodied in an excimer laser stepper, each magnetic image can be printed while continuously moving a wafer stage 2, without stopping the same. Namely, what can be called a "flash on the fly" process may be used, to reduce the time and to improve the throughput.

An excimer laser is a pulsed laser, and its pulse duration is about 20 nsec/pls. If the stage moves at a speed of 100 mm/sec, then for 20 nsec it runs through 0.02 micron. Thus, there does not occur a problem of "image flow". Also, while the exposure of actual device patterns according to the "flash on the fly" process, as is known in the art, is based on the possibility that the stage passes a certain target point which is predetermined at least with respect to two axis-directions of an X—Y coordinate, and the exposure is executed just at the moment of passage. However, the "flash on the fly" process which may be adopted in this embodiment is only such that the exposure is made during a substantial time period of passage of the stage through a certain tolerance region of a certain range and it is sufficient that the coordinate position of the stage just at the moment of exposure is read by using a laser interferometer. Therefore, clearly it can be executed very easily as compared with the former.

The KrF excimer laser stepper shown in FIG. 5 includes a band narrowing means which may comprise an etalon or a grating, for example, and which is provided within the light source device 91. By this band narrowing means, the bandwidth $\Delta\lambda$ of the KrF laser can be narrowed to an order of $\Delta\lambda=0.05$ nm. Further, the projection lens system 5 is provided by plural lens elements all of which are made of $SiO_2$, and the projection lens system is adapted to sufficiently transmit the KrF laser beam of a wavelength $\lambda$ of an order of $\lambda=248.4$ nm.

FIG. 9 is a schematic view of an alignment and exposure apparatus according to a third embodiment of the present invention. Like numerals are assigned to those elements having similar or corresponding functions as of those shown in FIGS. 1 and 5. Also, for simplification, the illumination optical system A is diagrammatically illustrated. For the same reason, some elements of an off-axis alignment scope C are not illustrated. While the scope C comprises a polarization microscope as in the foregoing embodiment, no mirror such as at 27 for deflecting the optical path is used.

An important feature of the present embodiment resides in that a reticle alignment scope B is utilized to illuminate a magnetic image forming alignment mark 53 of the reticle 9, whereby a magnetic image of the mark is formed in a portion of the magneto-optic recording material layer provided on a wafer chuck 3.

The reticle alignment scope B includes a stop 20 for restricting the range of illumination, an image pickup device 110 and an objective optical system 140, and is operable to extract a portion of the photoprinting light from the illumination optical system A (for example, an excimer laser beam), to illuminate a reticle alignment mark or marks, not shown. Then, through the objective optical system 140, an image of the reticle alignment mark is picked up by the image pickup device 110, and any deviation of the reticle alignment mark with respect to a reference provided at a stationary portion of the exposure apparatus is detected. On the basis of the result of detection, the position of the reticle 9 can be adjusted (aligned).

The objective optical system 140 is movable or translatable along the surface (pattern bearing surface) of the reticle 9. Thus, regardless of the position of the reticle alignment mark, the same can be detected by the optical system 140. In this embodiment, after completion of the reticle 9 alignment, the position of the objective optical system 140 is changed to allow illumination of a magnetic image forming mark 53. Then, with the light from the reticle alignment scope, the mark 53 is illuminated and, through the projection lens system 5, an image of the mark 53 is projected upon a magneto-optic recording material layer provided on the wafer chuck 3. By this, a magnetic image is formed in a portion of the magneto-optic recording material layer. The reticle-to-wafer alignment using the thus formed magnetic image can be made essentially in the same way as having been described with reference to the foregoing embodiments. Therefore, a description thereof will be omitted here.

In this embodiment, the thus formed magnetic image can be used for measurement of the distance between optical axes of the projection lens system 5 and the off-axis alignment scope C. The distance between these optical axes is called a "base line" and it is one of the important system parameters in an exposure apparatus that includes an off-axis alignment scope such as at C. That is, in such exposure apparatus usually the position of an alignment mark on a wafer 4 is detected through an off-axis alignment scope C and then a wafer stage 2 is displaced, in accordance with a preset value for the distance between the optical axes, to position the wafer 4 with respect to the position whereat a pattern is to be projected through the projection lens system 5. Actually, however, the distance between the optical axes is variable with time. Thus, it is desirable to accurately detect the change in the distance or the changed distance between the optical axes.

In this embodiment, in accordance with the data concerning the distance between the optical axes, having been stored in preparation, the wafer stage 3 is displaced to introduce a magnetic image, formed in a portion of the magneto-optic recording layer on the wafer chuck 3, into the view field of the off-axis alignment scope C. Then, the position of the magnetic image with respect to a predetermined reference provided in the alignment scope C is detected. On the basis of the detection, the data related to the distance between the optical axes can be corrected and thus the current distance can be detected exactly.

In accordance with the present invention, as has hitherto been described, a wafer chuck for holding a wafer by attraction is provided with a recording layer made of, for example, a magneto-optic recording material or a photochromic material. One or more alignment marks of a reticle are transferred through a projection system onto this recording layer and, on the basis of a positional relationship between the transferred image of the alignment mark and an alignment mark provided on the wafer, the reticle-to-wafer alignment or the alignment of each shot area of the wafer to the reticle can be made exactly.

Accordingly, regardless of a wafer process, high-precision alignment is always assured.

Since the magneto-optic recording material or the photochromic material is such a recording material that allows both writing and erasing, there is a specific advantage that the recording material can be used repeatedly.

Additionally, on the basis of the state of an alignment mark image as transferred onto a recording layer of a wafer chuck (i.e., by detecting the position or contrast of the image), any error in the magnification of a projection lens system, any error in the rotational ($\theta$) direction of a reticle, any error in the distance (base line) between the optical axes of the projection lens system and an off-axis microscope, any error in the position of the wafer with respect to the direction of the optical axis of the projection lens system (i.e., focus error), and the like can be detected.

While the invention has been described with reference to the structures disclosed herein, it is not confined to the details set forth and this application is intended to cover such modifications or changes as may come within the purposes of the improvements or the scope of the following claims.

What is claimed is:

1. A step-and-repeat type projection exposure apparatus for projecting a device pattern of a reticle on different zones of a workpiece in sequence through a projection optical system, wherein said apparatus comprises:
    a reticle holder for holding the reticle;
    a workpiece holder for holding the workpiece;
    a movable stage for holding the workpiece holder;
    wherein said workpiece holder has a plurality of recording areas each being provided by a magneto-optical material, a photochromic material, or a photosensitive material, the recording areas being located around the periphery of the workpiece held by said workpiece holder,
    wherein said movable stage is adapted to move said workpiece holder so that on each of the recording areas an image of a mark of the reticle is projected and thus recorded through the projection optical system; and
    detecting means for detecting the images recorded on the recording areas of said workpiece holder and means for determining, on the basis of obtained data, the coordinates of the pattern array on the workpiece for step-and-repeat exposures of the workpiece.

2. An apparatus according to claim 1, wherein the reticle has four-marks located substantially equidistantly around said workpiece holding means.

3. An apparatus according to claim 1, wherein the surface of each recording area is set at substantially the same level as the surface of the workpiece.

4. An apparatus according to claim 1, further comprising erasing means for erasing the image recorded on the plurality of recording areas.

5. A semiconductor manufacturing method for use with a step-and-repeat type projection exposure apparatus having an original holder for holding an original with a device pattern and a plurality of marks, a workpiece holder for holding the workpiece having different zones, and a movable stage for holding the workpiece holder, the method comprising steps of:
    providing on the workpiece holder a plurality of recording areas at sites around the periphery of the workpiece as it is held by the workpiece holder, wherein each of said recording areas is provided by at least one of a magneto-optical material, a photochromic material, and a photosensitive material;
    projecting the device pattern of the original on the different zones of the workpiece in sequence while moving the workpiece holder through the movable stage;
    recording on each recording area an image related to at least one of the marks of the original, while moving the workpiece holder through the movable stage;
    detecting the images recorded on the recording areas, sequentially; and
    controlling the motion of the movable stage for step-and-repeat exposures of the workpiece, on the basis of data produced through said detection step.

6. A method according to claim 5, wherein the surface of each recording area is set at substantially the same level as the surface of the workpiece.

7. A method according to claim 5, further comprising the step of erasing the images recorded on the recording areas.

8. A projection exposure apparatus for projecting a device pattern of a reticle on different zones of a workpiece in sequence, said apparatus comprising:
    a reticle holder for holding the reticle;
    a workpiece holder for holding the workpiece;
    a movable stage for holding said workpiece holder;
    wherein said workpiece holder has a plurality of recording areas each being provided by at least one of a magneto-optical material, a photochromic material, and a photosensitive material, said recording areas being located around the periphery of the workpiece held by said workpiece holder;

wherein said movable stage is adapted to move said workpiece holder so that on each of said recording areas an image of a mark of the reticle is projected and thus recorded; and detecting means for detecting the images recorded on said recording areas of said workpiece holder, and for determining, on the basis of obtained data, the coordinates of a pattern array on the workpiece for exposures of different zones of the workpiece in sequence.

9. An apparatus according to claim 8, wherein the reticle has four marks located substantially equidistantly around said workpiece holder.

10. An apparatus according to claim 8, wherein the surface of each recording area is set at substantially the same level as the surface of the workpiece.

11. An apparatus according to claim 8, further comprising erasing means for erasing the images recorded on said recording areas.

12. A semiconductor device manufacturing method for use with a projection exposure apparatus having an original holder for holding an original with a device pattern and a plurality of marks, a workpiece holder for holding the workpiece having different zones, and a movable stage for holding the workpiece holder, said method comprising the steps of:

providing on the workpiece holder a plurality of recording areas at sites around the periphery of the workpiece as the workpiece is held by the workpiece holder, wherein each of the recording areas is provided by at least one of a magneto-optical material, a photochromic material, and a photosensitive material;

projecting the device pattern of the original on the different zones of the workpiece in sequence while moving the workpiece holder with the movable stage;

recording on each recording area an image related to at least one of the marks of the original, while moving the workpiece holder with the movable stage;

detecting the images recorded on the recording areas, sequentially; and controlling the motion of the movable stage for exposures of the workpiece, on the basis of data produced by said detecting step.

13. A method according to claim 12, wherein the surface of each recording area is set at substantially the same level as the surface of the workpiece.

14. A method according to claim 12, further comprising the step of erasing the images recorded on the recording areas.

* * * * *

UNITED STATES PATENT AND TRADEMARK OFFICE
CERTIFICATE OF CORRECTION

PATENT NO. : 5,386,269
DATED : January 31, 1995
INVENTOR(S) : MASAO KOSUGI

It is certified that error appears in the above-indentified patent and that said Letters Patent is hereby corrected as shown below:

COLUMN 1

Line 15, "ARTS" should read --ART--.
Line 19, "scaled" should read --scale--.
Line 26, "the" should read --the processing ability--.

COLUMN 2

Line 17, "Briefly,in" should read --Briefly, in--.

COLUMN 4

Line 17, "plate 31," should read --plate 310,--.
Line 23, "plate 31." should read --plate 310.--.

COLUMN 6

Line 56, "on" should read --an--.

COLUMN 7

Line 43, "occasion," should read --cases--.

COLUMN 8

Line 54, "has" should read --have--.

UNITED STATES PATENT AND TRADEMARK OFFICE
CERTIFICATE OF CORRECTION

PATENT NO. : 5,386,269

DATED : January 31, 1995

INVENTOR(S) : MASAO KOSUGI

It is certified that error appears in the above-indentified patent and that said Letters Patent is hereby corrected as shown below:

<u>COLUMN 12</u>

Line 19, "four-marks" should read --four marks--.

Signed and Sealed this

Ninth Day of May, 1995

Attest:

BRUCE LEHMAN

Attesting Officer     Commissioner of Patents and Trademarks